United States Patent [19]
Higashitani et al.

[11] Patent Number: 6,159,795
[45] Date of Patent: Dec. 12, 2000

[54] LOW VOLTAGE JUNCTION AND HIGH VOLTAGE JUNCTION OPTIMIZATION FOR FLASH MEMORY

[75] Inventors: Masaaki Higashitani, Sunnyvale; Hao Fang, Cupertino; Narbeh Derhacobian, Belmont, all of Calif.

[73] Assignees: Advanced Micro Devices, Inc., Sunnyvale, Calif.; Fujitsu Limited, Japan

[21] Appl. No.: 09/109,664

[22] Filed: Jul. 2, 1998

[51] Int. Cl.$^7$ .................. H01L 21/336; H01L 21/8234
[52] U.S. Cl. .................. 438/257; 438/976; 438/275; 438/258; 438/266
[58] Field of Search .................. 438/257, 976, 438/275, 266, 258

[56] References Cited

U.S. PATENT DOCUMENTS

| | | | |
|---|---|---|---|
| 4,775,642 | 10/1988 | Chang et al. | 437/44 |
| 5,194,924 | 3/1993 | Komori et al. . | |
| 5,395,778 | 3/1995 | Walker | 437/43 |
| 5,449,634 | 9/1995 | Inoue | 437/52 |
| 5,516,713 | 5/1996 | Hsue et al. . | |
| 5,574,685 | 11/1996 | Hsu . | |
| 5,668,034 | 9/1997 | Sery et al. . | |
| 5,679,585 | 10/1997 | Gardner et al. . | |
| 5,783,471 | 7/1998 | Chu | 438/257 |
| 5,879,990 | 3/1999 | Dormans et al. | 438/257 |
| 5,942,780 | 8/1999 | Barsan et al. | 257/321 |

FOREIGN PATENT DOCUMENTS

| | | |
|---|---|---|
| 6-177399 | 6/1994 | Japan . |

*Primary Examiner*—Richard Elms
*Assistant Examiner*—A. Pyonin
*Attorney, Agent, or Firm*—Renner, Otto, Boisselle & Sklar, L.L.P.

[57] ABSTRACT

An intermediate implant step is performed to optimize the performance of the transistors in the peripheral portion of a floating gate type memory integrated circuit. The polysilicon layer (Poly 1) that forms the floating gate in the respective floating gate type memory devices prevents penetration of the optimizing implant into the core region in which the floating gate memory devices are formed. This permits the optimization implant to be performed without the need for an additional mask, thus reducing costs and production time.

11 Claims, 4 Drawing Sheets

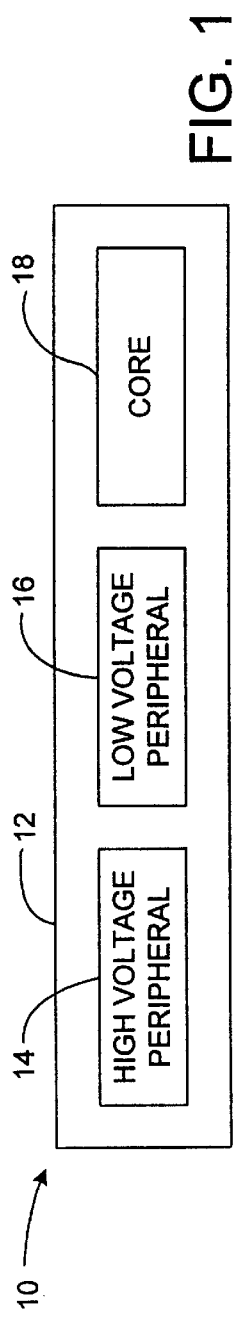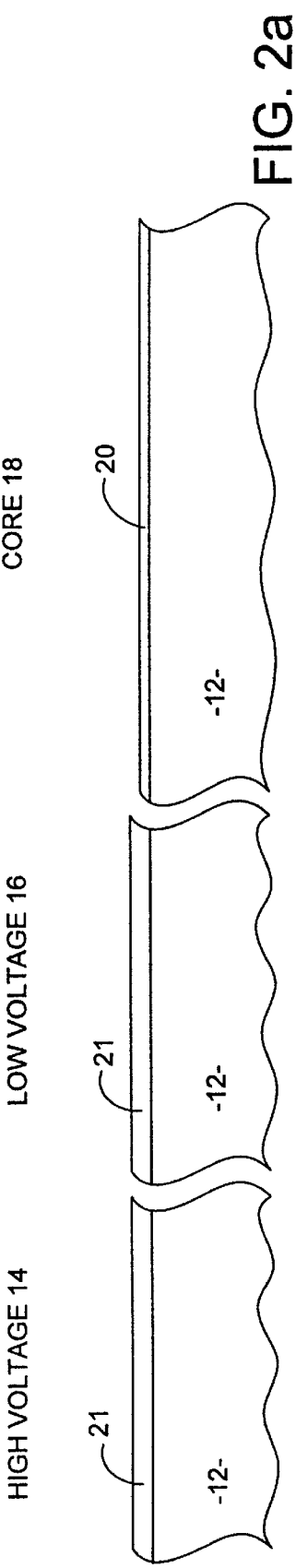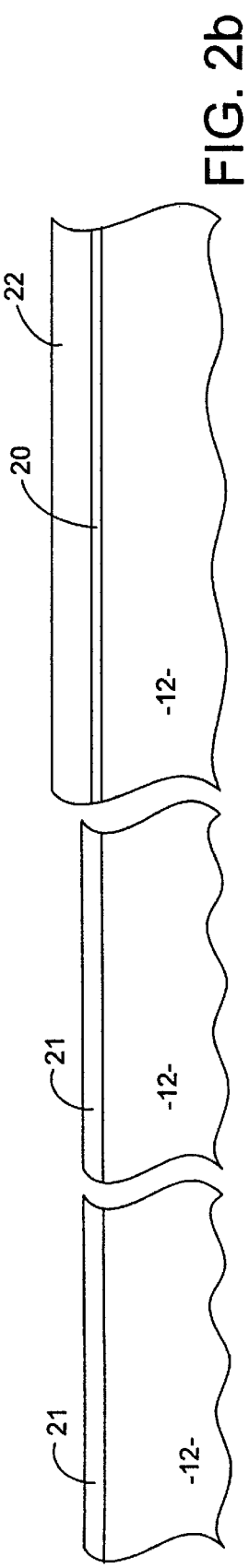

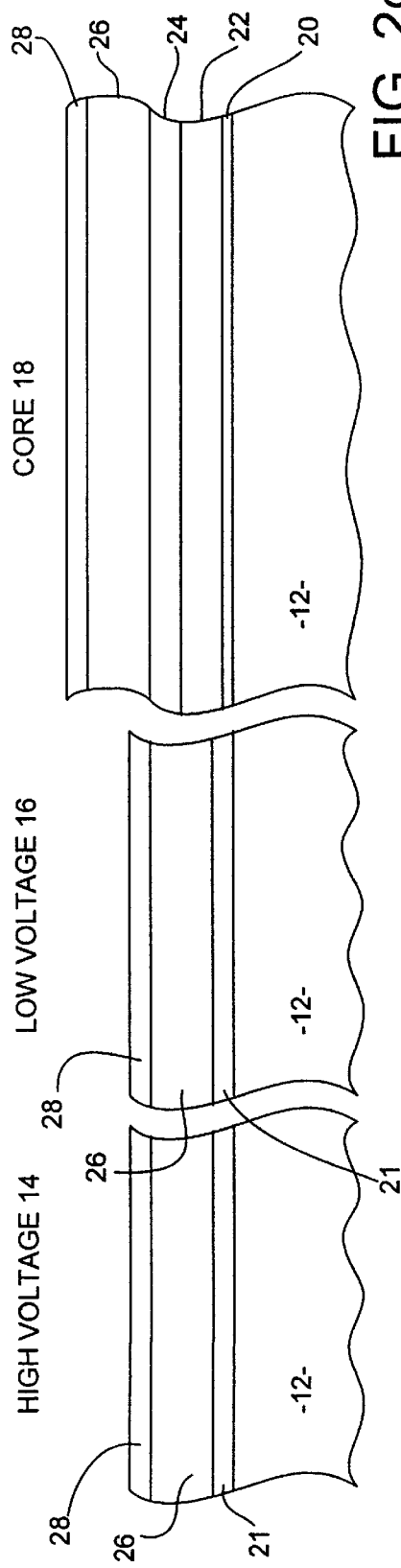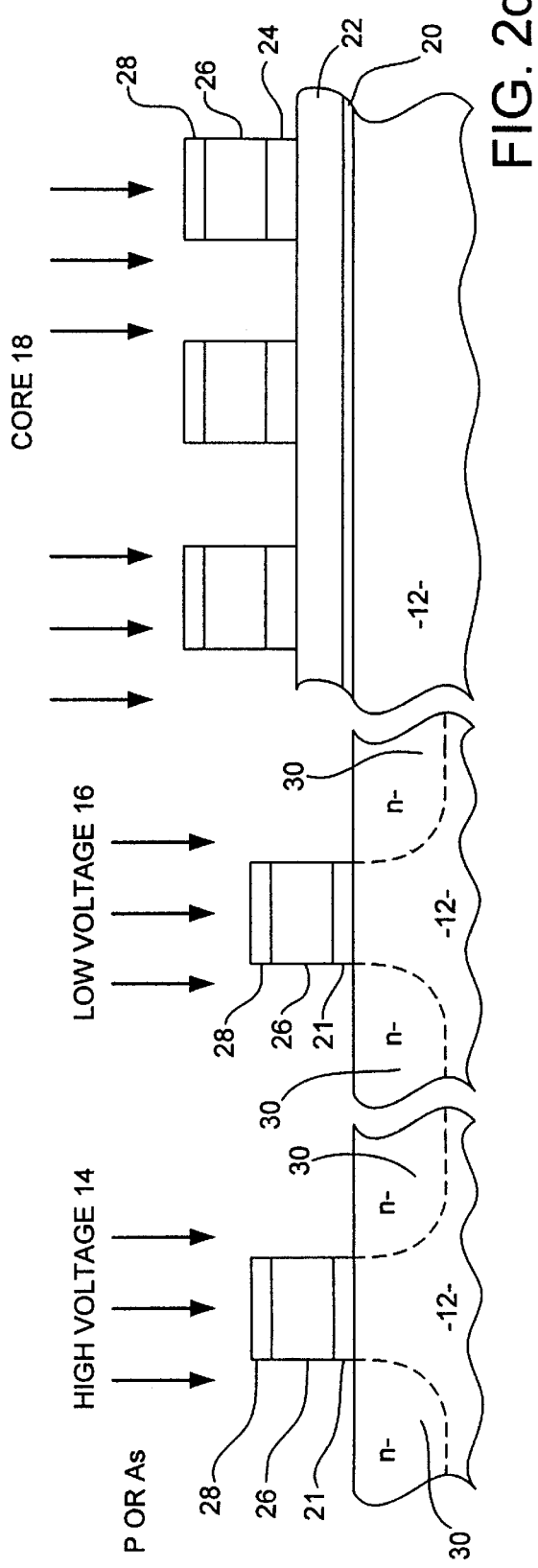

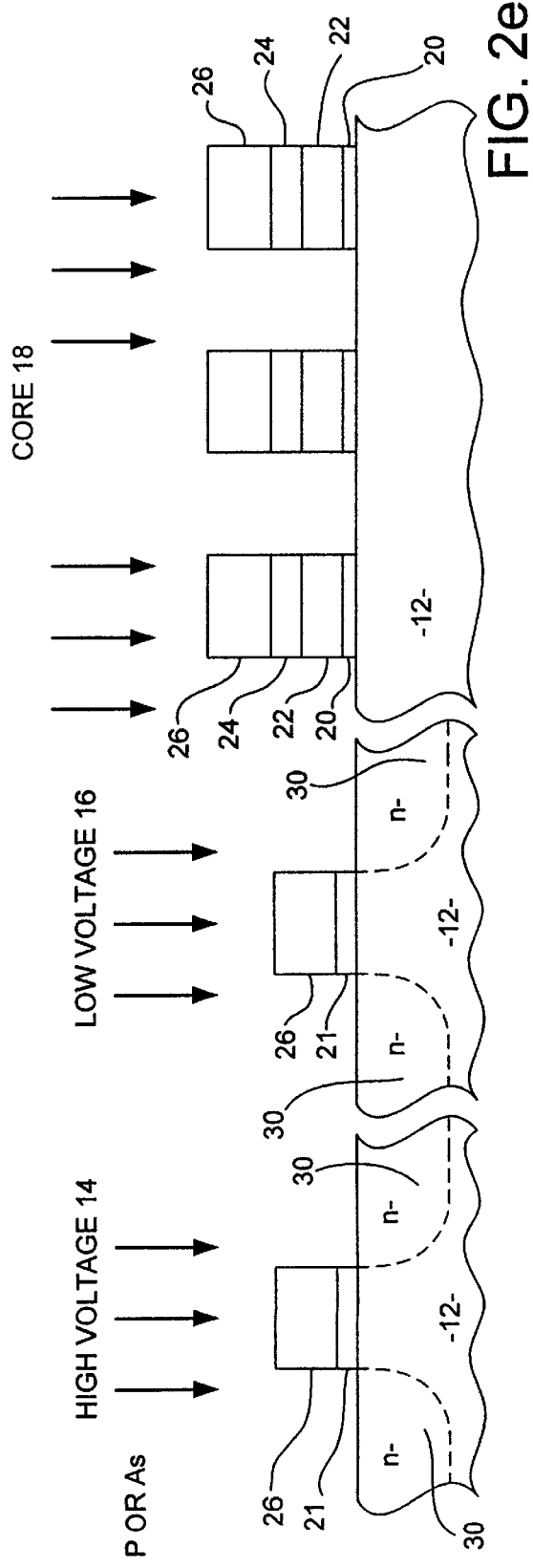
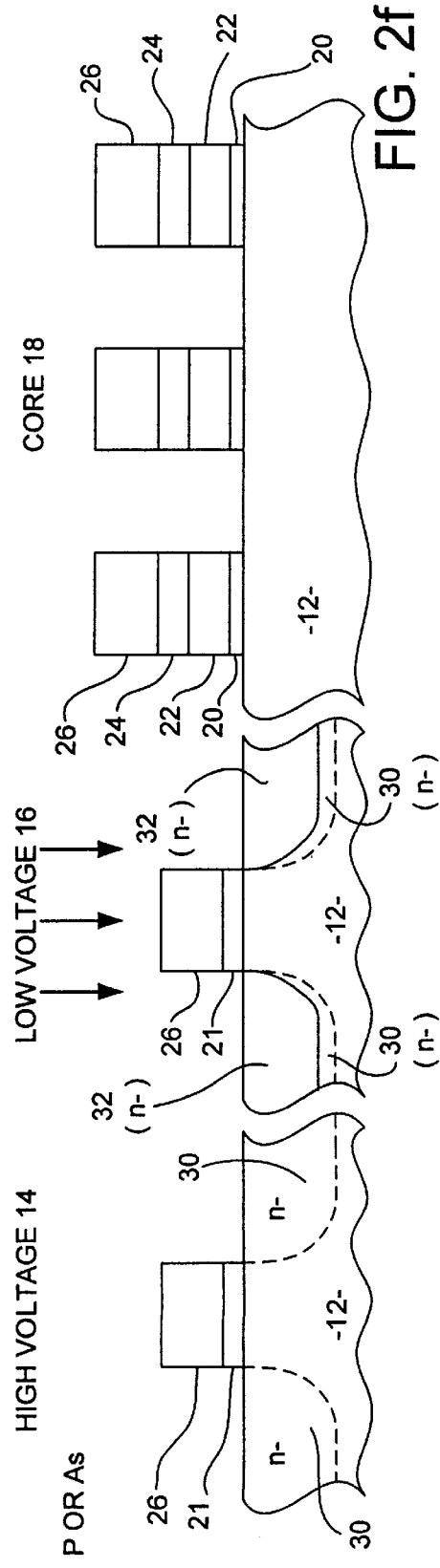

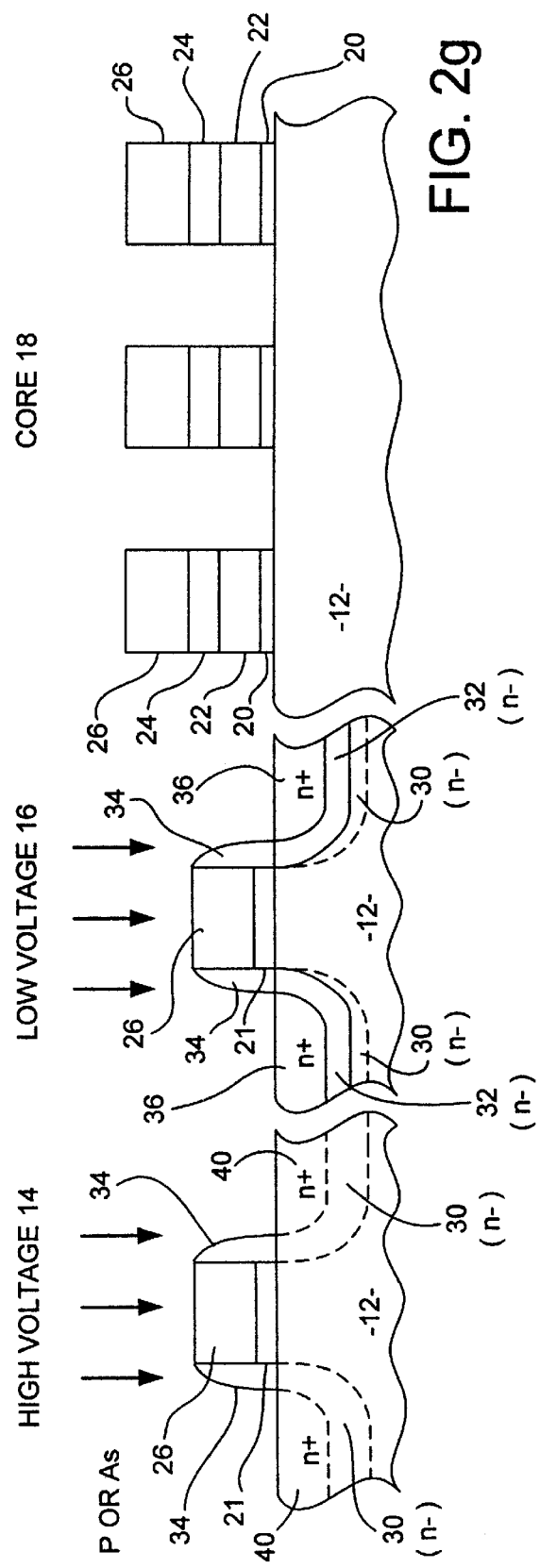

6,159,795

LOW VOLTAGE JUNCTION AND HIGH VOLTAGE JUNCTION OPTIMIZATION FOR FLASH MEMORY

TECHNICAL FIELD

The present invention relates generally to integrated circuit memories, and specifically to the fabrication and optimization of high voltage transistors, low voltage transistors, and core array transistors in integrated circuits which employ floating gate memory devices.

BACKGROUND OF THE INVENTION

FIG. 1 schematically represents a conventional flash type electrically-erasable programmable read-only-memory (EEPROM) integrated circuit 10. The EEPROM 10 typically is manufactured on a silicon substrate 12 having a high voltage peripheral circuit region 14, standard peripheral circuit region 16, and core region 18 formed thereon. As is known with such conventional flash EEPROMs, the core region 18 is made up of an array of core transistors making up floating gate memory devices. The peripheral circuit region 16 typically includes MOS-type low voltage transistors such as those used to form a row decoder which is connected to the core array. The high voltage peripheral circuit region 14 typically includes MOS-type high voltage transistors designed for use in programming and erase operations.

The different types of transistors have different requirements insofar as operation, applied voltages, etc. Accordingly, oftentimes it is desirable to optimize the transistors based on how the transistors will be utilized in the device. For example, it may be desirable to customize the voltage junctions experienced by the high voltage and/or low voltage transistors as compared to the core transistors. In the past, this would require the use of one or more additional masks as part of an implant step. The additional mask(s) added to the production cost and time associated with the manufacture of the device.

In view of the aforementioned shortcomings, there exists a strong need in the art for a process by which the voltage junctions for the high and/or low transistors may be optimized without requiring an additional masking step.

SUMMARY OF THE INVENTION

According to a first aspect of the invention, a method is provided for manufacturing a floating gate type memory device. The method includes the steps of forming a gate oxide layer on a surface of a substrate in a peripheral region, and forming a tunnel oxide layer on the surface of the substrate in a memory core region; forming a first conductive layer on the tunnel oxide layer to function as a floating gate for transistors to be formed in the core region; forming a dielectric layer on the first conductive layer; forming a second conductive layer on the dielectric layer in the core region and on the gate oxide layer in the peripheral region; selectively removing portions of the second conductive layer, the dielectric layer, and the gate oxide layer to form gate structures for at least one transistor in the peripheral region and the transistors in the core region; performing an implant step to implant a dopant in a source region and a drain region in the substrate adjacent the gate structure of the at least one transistor in the peripheral portion, the first conductive layer functioning as a masking layer to prevent penetration of the dopant into the substrate in areas adjacent the gate structures of the transistors to be formed in the core region; and subsequent to the implanting step, selectively removing portions of the first conductive layer in the core region to define respective floating gates for the transistors to be formed in the core region.

In accordance with another aspect of the invention, a method is provided for optimizing a voltage junction in a transistor included in a floating gate type memory device. The method includes the steps of forming a gate structure for the transistor on a surface of a substrate in a peripheral region of the substrate; forming at least a partial gate structure for each of a plurality of floating gate memory devices on the surface of the substrate in a core region, the partial gate structure including a first conductive layer which will function as a floating gate in each of the floating gate memory devices, performing an implant step to implant a dopant in a source region and a drain region in the substrate adjacent the gate structure of the transistor in the peripheral portion, the first conductive layer functioning as a masking layer to prevent penetration of the dopant into the substrate in areas adjacent the at least partial gate structures of the floating gate memory devices to be formed in the core region; and subsequent to the implanting step, selectively removing portions of the first conductive layer in the core region to define the respective floating gates.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a block diagram representing a flash type electrically erasable programmable read-only-memory (EEPROM); and FIGS. 2a–2g are cross-sections illustrating the relevant process steps utilized in forming the high voltage, low voltage, and core transistors in the flash EEPROM of FIG. 1 in accordance with the present invention.

DESCRIPTION OF THE PREFERRED EMBODIMENT

The present invention will now be described with reference to the drawings, wherein like reference numerals are used to refer to like elements throughout. In the preferred embodiment, the method of the present invention is used in conjunction with a process for fabricating a flash EEPROM memory device as represented in FIG. 1. However, it will be appreciated that the invention has application with other devices which rely on tunneling of carriers between a substrate and a floating gate. Throughout the following description, the various transistors and the process to fabricate the same are principally described in terms of an n-channel native device. Structural and processing differences between native and n-type and p-type enhancement devices are noted where appropriate.

As is described in more detail below, the invention involves forming simultaneously the high voltage transistors, low voltage transistors, and core array transistors in regions 14, 16 and 18, respectively. Relevant processing steps carried out in connection with forming a flash EEPROM are described herein. Various steps not germane to the invention and otherwise conventional are omitted for sake of brevity.

Referring initially to FIG. 2a, the process in accordance with the present invention begins with forming a tunnel oxide layer 20 over a p-type silicon substrate 12 in the core region 18. The tunnel oxide layer 20 may be formed, for example, using a thermal growth process in a dry oxidation furnace. The thickness of the tunnel oxide layer 20 may be in the range of 50 to 150 Angstroms (Å), for example. A gate oxide layer 21 is formed on the substrate 12 in regions 14 and 16 for the MOS-type high voltage and low voltage transistors, respectively. The gate oxide layer 21 may be similarly grown via a thermal growth process.

Next, a first layer of polycrystalline silicon 22 (FIG. 2b) (oftentimes referred to as a "Poly 1" layer) is formed on top of the tunnel oxide layer 20 and gate oxide layer 21. The polysilicon layer 22 is deposited uniformly over each of the regions 14, 16 and 18 using, for example, low pressure chemical vapor deposition ("LPCVD"). The polysilicon layer 22 preferably has a thickness in the range of 100 to 2,000 Å. The polysilicon layer 22 is doped via, for example, diffusion doping or ion implantation doping techniques so as to reduce its resistivity. The polysilicon layer 22 is then patterned and etched, using conventional polysilicon etching techniques, to completely remove the polysilicon layer 22 from the high voltage and low voltage regions 14 and 16, respectively, resulting in the structure shown in FIG. 2b.

Next, a multi-layer interpoly dielectric 24 is formed over the surface of the substrate 12, and specifically on the gate oxide layers 21 in regions 14 and 16, and the polysilicon layer 22 in the core region 18. This layer 24 is often called the interpoly dielectric since, as will be discussed shortly below, it is sandwiched between the first polysilicon layer 22 and a second polysilicon layer which forms the control gate for each of the memory devices in the core region 18. The interpoly layer 24 is preferably a three layer structure of oxide/nitride/oxide (ONO) as is commonly known, and has an overall thickness in the range of 50 to 400 Å. The interpoly layer 24 may be formed by repetitive depositions of oxide, nitride and oxide as is well known by those skill in the art to form a dielectric layer in which nitride is sandwiched between two oxide layers. Following formation of the interpoly layer 24, the interpoly layer 24 is subjected to conventional ONO patterning and etching so as to remove the interpoly layer 24 from the peripheral regions 14 and 16, thus leaving the gate oxide layers 21 exposed as represented in FIG. 2c.

Continuing to refer to FIG. 2c, a second layer of polycrystalline silicon 26 (oftentimes referred to as a "Poly 2" layer) is uniformly formed on the substrate 12. Specifically, the polysilicon layer 26 is formed on top of the interpoly layer 24 in the core region 18, and on the gate oxide layers 21 in regions 14 and 16. The polysilicon layer 26 is deposited using, for example, LPCVD techniques as are known. The polysilicon layer 26 may also include a silicide such as a tungsten silicide ($WSi_2$) or a titanium silicide ($TiSi_2$). The polysilicon layer 26 preferably has a thickness in the range of 500 to 3,000 Å. The polysilicon layer 26 is doped via, for example, diffusion doping or ion implantation doping techniques so as to reduce its resistivity. As is conventional, the polysilicon layer 26 is used to form the control gates and word line interconnects for the memory devices to be formed in the core region 18. In addition, however, the polysilicon layer 26 is used to form the gates of the MOS transistors to be formed in regions 14 and 16 as is discussed more fully below.

A resist layer 28 is then formed on the polysilicon layer 26 across all of the regions 14, 16 and 18, as represented by the structure shown in FIG. 2c. The resist layer 28 is then patterned using masks and known lithography techniques to define the control gate structure and word line interconnects for the memory devices in the core region 18. In addition, the resist layer is patterned to define the gate structures for the MOS transistors to be formed in regions 14 and 16.

Following such patterning steps of the resist layer 28, an etch of the polysilicon layer 26 (Poly 2 layer) is performed using conventional polysilicon etching techniques to define the gate electrodes of the MOS transistors in regions 14 and 16. In addition, the polysilicon layer 26 in the core region 18 is etched simultaneously to define the control gates of the memory devices as represented in FIG. 2d. Following the etching of the polysilicon layer 26, the interpoly layer 24 is etched using known ONO etching techniques to define the stacked interpoly region of each of the memory devices in the core region 18. Finally, the gate oxide layer 21 in the high voltage and low voltage regions 14 and 16 is etched using known oxide etching techniques to define the gate oxide regions of the MOS transistors in regions 14 and 16. Consequently, the structure shown in FIG. 2d results.

It will be noted that, as shown in FIG. 2d, the polysilicon layer 22 (Poly 1) remains atop the tunnel oxide layer 20 in the core region 18. In the past, the polysilicon layer 22 and tunnel oxide layer 20 simply would have been etched away to define the stacked gate structures for the memory devices in the core region 18. However, the present invention includes an intermediate step designed to optimize the performance of the high voltage transistors in region 14 in combination with the optimization of the low voltage transistors in region 16 without requiring additional masks. Specifically, an implant step using a low energy n-type dopant (e.g., phosphorus (P) or arsenic (As)) is performed in what are to become the source and drain regions of the MOS transistors in the regions 14 and 16. Advantageously, the polysilicon layer 22 (Poly 1) prevents penetration of the n-type dopant into the memory devices of the core region 18.

For example, a phosphorus or arsenic dopant is implanted on the structure shown in FIG. 2d. The implant step is performed uniformly across the substrate 12.

The combined intermediate gate structure of the resist layer 28, polysilicon layer 26 and gate oxide layer 21 for the transistors in regions 14 and 16 allow for a self-aligned implant forming $n^-$ regions 30. In the example shown in FIG. 2d, a phosphorus P implant is performed to form regions 30. The implant step is carried out at a very low dose level and low energy, for example in the range of $1 \times 10^{11}$ ions/$cm^2$ to $1 \times 10^{13}$ ions/$cm^2$, and 1 keV to 40 keV, respectively, for a period of time of about 5 seconds to about 1 minute. The polysilicon layer 22 in the core region 18, in such case, serves to block the phosphorus or arsenic implants from penetrating the active regions of the substrate 12 in the core region 18. Thus, the implant step represented in FIG. 2d may be performed without requiring any additional masks or mask layers.

As is known, phosphorus or arsenic implants in the active regions of the high voltage and low voltage transistors in regions 14 and 16 are useful in reducing the voltage gradient in the source and drain junctions of n-channel devices. Otherwise, a large voltage gradient can result in breakdown of the transistors, particularly in the case of the high voltage transistors in region 14. Hence, the step of performing the implant helps to optimize the performance of the transistors, particularly in the high voltage region 14. At the same time, the polysilicon layer 22 prevents the implants from penetrating the active regions of the memory devices in the core region 18. Penetration of the implants into the active regions of the core region 18 is undesirable because the core transistor channel length is very small compared with the normal peripheral transistor size. Therefore if impurity dopant penetration occurs in the core region, significant short channel effects will undesirably occur.

Subsequent to the implant step represented in FIG. 2d, a self-aligned etching (SAE) of the polysilicon layer 22 (Poly 1) layer is performed to remove the polysilicon layer 22 between the stacked gate structures in the core region 18. Such removal of the polysilicon layer is performed using known polysilicon etching techniques. Thereafter, the tunnel oxide layer 20 is removed between the stacked gate structures in the core region 18 using known self-aligned etching techniques of the tunnel oxide, for example. Thereafter, the remaining resist layer 28 is stripped away resulting in the structure shown in FIG. 2e.

Consequently, it will be appreciated that by introducing an implantation step between the removal of the interpoly layer 24 and the polysilicon layer 22 (Poly 1) an additional voltage junction optimization step is provided. At the same time, the polysilicon layer 22 serves to prevent penetration of the implant material into the active areas of the core region 18. There is no need for formation of an additional mask in order to perform the implant step while preventing penetration into the core region 18, thus reducing manufacturing costs, production time, etc. The implant step can be carried out simply as an intermediate step using the same mask layer(s) relied upon in the etching of the interpoly layer 24 and the polysilicon layer 22.

Following the steps represented in FIG. 2e, conventional processing steps are carried out to complete the transistors in each region 14, 16 and 18. For example, typically a lightly-doped drain (LDD) structure is formed in the active regions of the MOS transistors in the low voltage region 16. As represented beginning in FIG. 2f, the source and drain regions for the transistors in region 16 are formed by two implants. An LDD implant, as illustrated in FIG. 2f, forms LDD regions 32 which are self-aligned to the polysilicon layers 26 (serving as the gate electrodes for the transistors formed in region 16). The high voltage region 14 and core region 18 are masked during such implant step as is conventional. The LDD implant which forms regions 32 may consist of implanting an n-type dopant (e.g., phosphorus or arsenic) using conventional techniques to form n⁻ regions 32. This implant step is carried out at a dose level and energy which are higher than those of the previous implant step represented in FIG. 2d. For example, such implant is performed at a dose and energy level in the range of $1\times10^{13}$ ions/cm$^2$ to $1\times10^{14}$ ions/cm$^2$, and 20 keV to 60 keV, respectively, for a period of time of about 5 seconds to about 1 minute.

As shown in FIG. 2g, sidewall spacers 34 are then formed adjacent the gate structures of the transistors for the high voltage and low voltage regions 14 and 16, respectively. Such sidewall spacers 34 may be formed according to conventional techniques. After the sidewall spacer formation, a second LDD implant is performed according to conventional techniques to form the source/drain regions 36 in the transistors in the low voltage region 16. This second LDD implant is performed using an n-type dopant such as phosphorus or arsenic while applying a mask to prevent implants to the transistors in the high voltage and core regions 14 and 18, respectively. For example, such implant is performed at a dose and energy level in the range of $1\times10^{15}$ ions/cm$^2$ to $1\times10^{16}$ ions/cm$^2$, and 20 keV to 60 keV, respectively, for a period of time of about 5 seconds to about 1 minute.

In a subsequent implant step, an n-type dopant such as phosphorus or arsenic is implanted within the region 14 to form source/drain regions 40 for the high voltage transistors therein. Again, such implant step may be carried out using conventional techniques while the low voltage region 16 and core region 18 are masked. Such implant step to form regions 40 is performed at a dose and energy level in the range of $1\times10^{15}$ ions/cm$^2$ to $1\times10^{16}$ ions/cm$^2$, and 20 keV to 60 keV, respectively, for a period of time of about 5 seconds to about 1 minute.

Although not shown, final processing steps are performed to provide the appropriate dopants to the transistors in the core region 18. In addition, final processing steps are performed to provide the appropriate interconnects between the transistors in the different regions, provide an appropriate passivation layer atop the structure, etc. Each of these steps may be carried out in a variety of ways already known, hence detail has been omitted herein for sake of brevity.

The present invention is centered around the use of an intermediate implant step to optimize the performance of the transistors in the peripheral portion of the integrated circuit. The invention involves utilizing the polysilicon layer 22 (Poly 1), which is used to form the floating gates in the floating gate memory devices, to prevent penetration of the optimizing implant into the core region in which the floating gate memory devices are formed. This permits the optimization implant to be performed without the need for an additional mask, thus reducing costs and production time.

Although the invention has been shown and described with respect to certain preferred embodiments, it is obvious that equivalents and modifications will occur to others skilled in the art upon the reading and understanding of the specification. For example, temperatures, times, and suggested processing technologies are provided throughout the context of the present description. It should be understood, however, that the particular times, temperatures and technologies may be varied in accordance with well-known principles of semiconductor processing, and that such variances are to be considered within the scope of the invention.

The present invention includes all such equivalents and modifications, and is limited only by the scope of the following claims.

What is claimed is:

1. A method for manufacturing a floating gate type memory device, comprising the steps of:

forming a gate oxide layer on a surface of a substrate in a peripheral region, and forming a tunnel oxide layer on the surface of the substrate in a memory core region;

forming a first conductive layer on the tunnel oxide layer to function as a floating gate for a number of transistors to be formed in the memory core region;

forming a dielectric layer on the first conductive layer;

forming a second conductive layer on the dielectric layer in the memory core region and on the gate oxide layer in the peripheral region;

selectively removing a number of portions of the second conductive layer, the dielectric layer, and the gate oxide layer to form at least one gate structure for at least one transistor in the peripheral region and a number of gate structures for the transistors in the memory core region;

performing a first implant step to implant a dopant in a source region and in a drain region in the substrate adjacent the at least one gate structure of the at least one transistor in the peripheral region;

masking a number of substrate areas adjacent to the gate structures of the transistors to be formed in the memory core region with the first conductive layer during the first implant step; and subsequent to the first implant and masking steps, selectively removing portions of the first conductive layer in the memory core region to define a number of respective floating gates for the transistors in the memory core region.

2. The method of claim 1, wherein the peripheral region is to include both a number of high voltage transistors and a number of low voltage transistors, and the first implant step is performed at least with respect to a number of source regions and a number of drain regions of the high voltage transistors.

3. The method of claim 1, further comprising the step of performing a second implant step to implant a dopant at a higher density into the source region and the drain region of the at least one transistor, the second implant step being performed subsequent the step of selectively removing portions of the first conductive layer.

4. The method of claim 3, wherein the first implant step further comprises the step of implanting the dopant at a lower dose level and a lower energy level than the second implant step.

5. The method of claim 1, wherein the first conductive layer and the second conductive layer are each made of polysilicon.

6. A method for optimizing a voltage junction in a transistor included in a floating gate type memory device, comprising the steps of:

forming a gate structure for the transistor on a surface of a substrate in a peripheral region of the substrate;

forming at least a partial gate structure for each of a plurality of memory transistors on the surface of the substrate in a core region, the partial gate structure including a first conductive layer configured to function as a floating gate in each of the memory transistors;

performing an implant step to implant a dopant in a source region and a drain region in the substrate adjacent the gate structure of the transistor in the peripheral masking a number of substrate areas adjacent to the at least partial gate structures of the memory transistors with the first conductive layer during the implant step; and subsequent to the implant step, selectively removing portions of the first conductive layer in the core region to define the respective floating gates.

7. The method of claim 6, wherein the peripheral region is to include both a number of high voltage transistors and a number of low voltage transistors, and the implant step is performed at least with respect to a number of source regions and a number of drain regions of the high voltage transistors.

8. The method of claim 6, further comprising the step of performing a second implant step to implant a dopant at a higher density into the source region and the drain region of the transistor, the second implant step being performed subsequent the step of selectively removing portions of the first conductive layer.

9. The method of claim 8, wherein the first implant step further comprises the step of implanting the dopant at a lower dose level and a lower energy level than the second implant step.

10. The method of claim 6, wherein the first conductive layer is made of polysilicon.

11. The method of claim 6, wherein the gate structure of the transistor in the peripheral region and the at least partial gate structure for each of the memory transistors share a common second conductive layer.

* * * * *

UNITED STATES PATENT AND TRADEMARK OFFICE
CERTIFICATE OF CORRECTION

PATENT NO. : 6,159,795
DATED : December 12, 2000
INVENTOR(S) : Higashitani et al.

It is certified that error appears in the above-identified patent and that said Letters Patent is hereby corrected as shown below:

Column 7, claim 3,
Line 22, please insert the word -- to -- between "subsequent" and "the".

Column 8, claim 6,
Line 6, please insert -- ; -- after "peripheral".

Signed and Sealed this

Twelfth Day of March, 2002

Attest:

JAMES E. ROGAN
Attesting Officer          Director of the United States Patent and Trademark Office